(12) United States Patent
Spindler et al.

(10) Patent No.: US 7,719,180 B2
(45) Date of Patent: May 18, 2010

(54) INVERTED OLED DEVICE WITH IMPROVED EFFICIENCY

(75) Inventors: Jeffrey P. Spindler, Rochester, NY (US); Tukaram K. Hatwar, Penfield, NY (US)

(73) Assignee: Global OLED Technology LLC, Wilmington, DE (US)

(*) Notice: Subject to any disclaimer, the term of this patent is extended or adjusted under 35 U.S.C. 154(b) by 235 days.

(21) Appl. No.: 11/873,052

(22) Filed: Oct. 16, 2007

(65) Prior Publication Data

US 2009/0096352 A1    Apr. 16, 2009

(51) Int. Cl.
H05B 33/00    (2006.01)
(52) U.S. Cl. .......................................... 313/504; 445/23
(58) Field of Classification Search .......... 313/498–506
See application file for complete search history.

(56) References Cited

U.S. PATENT DOCUMENTS

| | | | |
|---|---|---|---|
| 4,769,292 A | | 9/1988 | Tang et al. |
| 4,885,211 A | | 12/1989 | Tang et al. |
| 6,436,559 B1 | | 8/2002 | Ueno et al. |
| 6,720,573 B2 | | 4/2004 | Son et al. |
| 2005/0264550 A1* | | 12/2005 | Ohshima et al. ............ 345/204 |
| 2006/0033115 A1 | | 2/2006 | Blochwitz et al. |
| 2006/0188745 A1 | | 8/2006 | Liao et al. |
| 2006/0251922 A1 | | 11/2006 | Liao et al. |
| 2007/0007882 A1* | | 1/2007 | Fukuoka et al. ............ 313/503 |
| 2008/0018237 A1* | | 1/2008 | Yamamoto et al. .......... 313/504 |

FOREIGN PATENT DOCUMENTS

| EP | 1 099 744 | 5/2001 |
|---|---|---|
| WO | 2006/019270 | 2/2006 |

OTHER PUBLICATIONS 5.2: Top-Emission White OLEDs for Large Area AMOLED Displays and Lighting Applications, by Jeffrey P. Spindler et al.

* cited by examiner

Primary Examiner—Joseph L Williams
Assistant Examiner—Brenitra M Lee
(74) Attorney, Agent, or Firm—McKenna Long & Aldridge LLP

(57) ABSTRACT

An inverted OLED device, comprising: a substrate; a cathode disposed on the substrate; an anode spaced from the cathode; at least one light-emitting layer disposed between the anode and the cathode; a hole-transporting layer disposed between the anode and the light-emitting layer(s); an electron-transporting layer disposed between the cathode and the light-emitting layer(s); a first electron-accepting layer disposed between the hole-transporting layer and the anode and including a first electron-deficient organic material constituting more than 50% by volume of the first electron-accepting layer and having a reduction potential greater than −0.5 V vs. a Saturated Calomel Electrode; and a second electron-accepting layer disposed between the electron-transporting layer and the cathode including a second electron-deficient organic material constituting more than 50% by volume of the second electron-accepting layer and having a reduction potential greater than −0.5 V vs. a Saturated Calomel Electrode.

10 Claims, 6 Drawing Sheets

INVERTED OLED DEVICE WITH IMPROVED EFFICIENCY

FIELD OF THE INVENTION

The present invention relates to OLED devices, and in particular to inverted OLED devices.

BACKGROUND OF THE INVENTION

An organic light-emitting diode device, also called an OLED, commonly includes an anode, a cathode, and an organic electroluminescent (EL) unit sandwiched between the anode and the cathode. The organic EL unit includes at least a hole-transporting layer (HTL), a light-emitting layer (LEL), and an electron-transporting layer (ETL). OLEDs are attractive because of their low drive voltage, high luminance, wide viewing-angle, and capability for full color displays and for other applications. Tang et al. described this multilayer OLED in their U.S. Pat. Nos. 4,769,292 and 4,885,211.

OLED devices are often constructed with the positive electrode or anode placed in contact with the substrate or support on which the OLED is constructed. This is known as normal or non-inverted OLED configuration. Low power consumption displays typically use an active matrix backplane where thin film transistors (TFT made of a-Si or LTPS) drive current to the OLED. In this case, the OLED stack is located at the source of the TFT, thus the anode of the OLED pixel is directly connected to the source of the driving TFT. Although this manufacturing process is much simpler, the circuit becomes dependent on the characteristics of the OLED materials. Any changes in the OLED voltage due to its aging behavior will affect both the voltage between the gate and the source (Vgs) and the current flowing through the driving TFT and OLED pixel (Ids). Alternately, if the OLED stack can be located at the drain of the drive TFT, changes in the OLED characteristics affects only the current (Ids) and not the voltage between gate and source (Vgs). But this requires an inverted OLED configuration where the cathode of the OLED is deposited first in order to connect the OLED cathode to the drain of the driving TFT. In the inverted OLED configuration, however, the deposition of organic layers must be reversed. Examples of inverted configuration are known in the art. Blochwitz et al. in U.S. Patent Application 2006/0033115, and Spindler et al. in *Conference Record of the 26th International Display Research Conference*, Society for Information Display, San Jose, Calif., 2006, pp. 51-54, describe some examples of inverted OLED structures. However, these devices have not performed very well due to poor or inadequate injection of holes and electrons at the anode and cathode interfaces, respectively. In particular, voltage rise over time can be very large in inverted structures. This produces difficulties in achieving desired luminance.

U.S. Pat. No. 6,436,559 (Ueno et al.), disclose the use of certain electron-deficient organic materials in a standard structure OLED device, that is, the anode is adjacent to the substrate. The preferred embodiment and example use the electron-deficient material in a layer adjacent the cathode.

U.S. Pat. No. 6,720,573 (Son et al.), disclose the use of certain electron-deficient organic materials in a standard structure OLED device. In this case, the material is used in a layer adjacent the anode.

Both Ueno et al. and Son et al., allege improved lifetime and lower initial operating voltage relative to devices not having such layers.

The present invention calls for a combination of two electron-accepting layers using electron-deficient organic materials in an inverted structure, that is, the cathode is adjacent to the substrate. One electron-accepting layer is provided between the hole-transporting layer and the anode whereas the other is provided between the electron-transporting layer and the cathode. Applicant has found that this combination of features provides the unexpected advantage of reduced voltage rise over the operating life of the device. There is no teaching or suggestion in Ueno et al. or Son et al., alone or in combination, for the presently claimed invention. Neither patent recognized that our claimed combination was necessary to provide this unexpected result of reduced voltage rise over time.

SUMMARY OF THE INVENTION

It is therefore an object of the present invention to provide an inverted OLED device, which shows a reduced rise in drive voltage with time.

This object is achieved by an inverted OLED device, comprising:
  a. a substrate;
  b. a cathode disposed on the substrate;
  c. an anode spaced from the cathode;
  d. at least one light-emitting layer disposed between the anode and the cathode;
  e. a hole-transporting layer disposed between the anode and the light-emitting layer(s);
  f. an electron-transporting layer disposed between the cathode and the light-emitting layer(s);
  g. a first electron-accepting layer disposed between the hole-transporting layer and the anode and including a first electron-deficient organic material constituting more than 50% by volume of the first electron-accepting layer and having a reduction potential greater than $-0.5$ V vs. a Saturated Calomel Electrode; and
  h. a second electron-accepting layer disposed between the electron-transporting layer and the cathode including a second electron-deficient organic material constituting more than 50% by volume of the second electron-accepting layer and having a reduction potential greater than $-0.5$ V vs. a Saturated Calomel Electrode.

It is an advantage of this invention that it gives a lower rise in drive voltage with aging in an inverted OLED device.

DETAILED DESCRIPTION OF THE INVENTION

Figure 1:
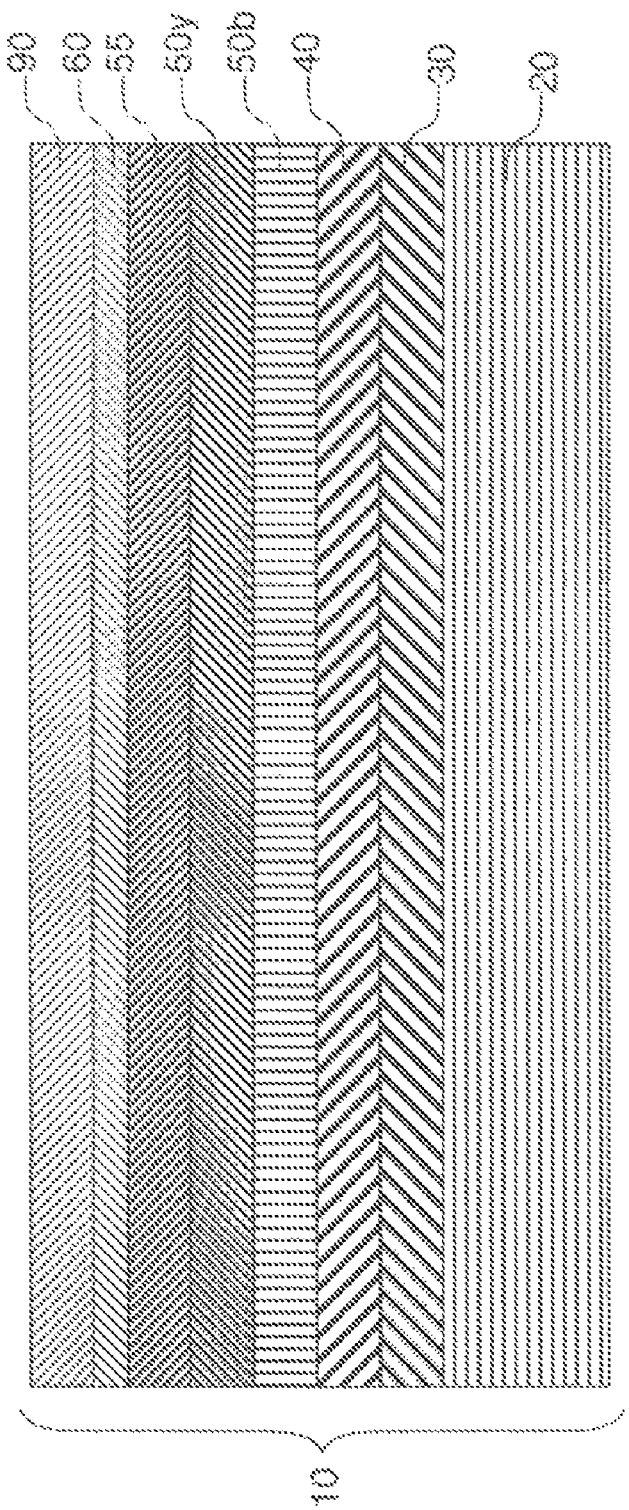
FIG. 1 (Prior Art) shows a cross-sectional view of a prior art inverted OLED device.

Turning now to FIG. 1, there is shown a cross-sectional view of a prior art inverted OLED device. Inverted OLED device 10 includes a cathode 30 disposed over substrate 20, and an anode 90 spaced from cathode 30. At least one light-emitting layer is disposed between anode 90 and cathode 30. In this particular embodiment, blue light-emitting layer 50b and yellow light-emitting 50y comprise the light-emitting layers. However, many different light-emitting layers or combinations of light-emitting layers can be used in both the non-inventive and inventive examples herein. Inverted OLED device 10 further includes a hole-transporting layer 55 disposed between anode 90 and the light-emitting layer(s) and in contact with at least one of the light-emitting layers, e.g. yellow light-emitting layer 50y. Inverted OLED device 10 further includes an electron-transporting layer 40 disposed between cathode 30 and the light-emitting layer(s) and in contact with at least one of the light-emitting layers, e.g. blue light-emitting layer 50b. Inverted OLED device 10 further includes a hole-injecting layer 60 disposed between hole-transporting layer 55 and anode 90 and including an electron-deficient material that facilitates the injection of holes. Anode 90 is in contact with hole-injecting layer 60.

Figure 2:
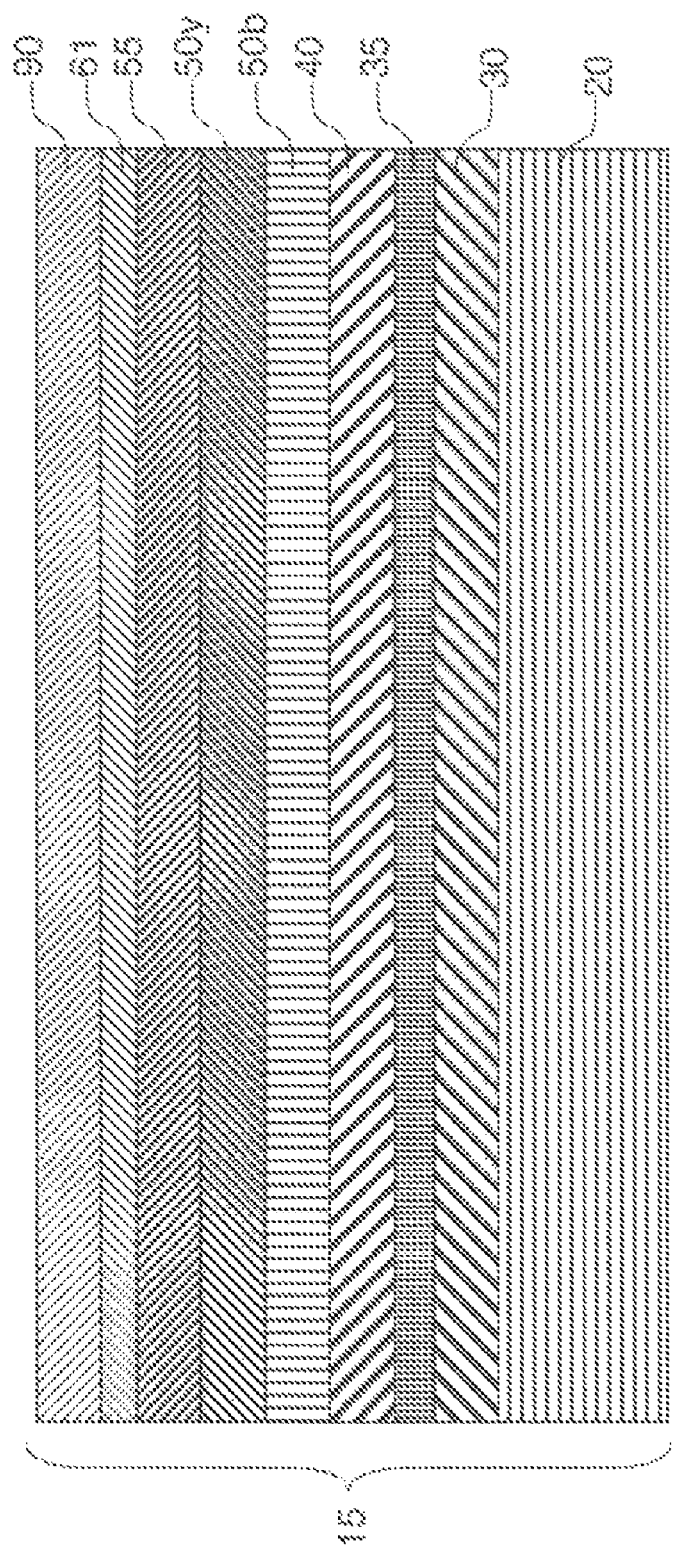
FIG. 2 shows a cross-sectional view of one embodiment of an inverted OLED device in accordance with this invention.

Turning now to FIG. 2, there is shown a cross-sectional view of one embodiment of an inverted OLED device in accordance with this invention. Inverted OLED device 15 includes the components of inverted OLED device 10, above, except that a first electron-accepting layer 61 containing a first electron deficient organic material has replaced the hole-injecting layer. Inverted OLED device 15 further includes a second electron-accepting layer 35 disposed between electron-transporting layer 40 and cathode 30. Cathode 30 is in contact with second electron-accepting layer 35 containing a second electron deficient organic material. These components will be described in greater detail.

The first and second electron-accepting layers of the present invention include one or more electron deficient organic materials, each having an electron-accepting property and a reduction potential greater than −0.5 V vs. a Saturated Calomel Electrode (SCE), and wherein the one or more electron deficient organic materials provide more than 50% by volume in the intermediate connector. The electron deficient organic materials of the first and second electron-accepting layers can be the same or different. For manufacturing simplicity, it is preferred that they are the same. For the same reason, it is preferred that the electron-accepting layer uses a single electron deficient organic material in 100% volume. Preferably, the first and second electron-accepting layers include one or more electron deficient organic materials having a reduction potential greater than −0.1 V vs. SCE. It is also preferable that the electron-accepting layers have effective optical transparency.

The term "reduction potential", expressed in volts, measures the affinity of a substance for an electron, the higher the positive number the greater the affinity. Reduction of hydronium ions into hydrogen gas would have a reduction potential of 0.00 V under standard conditions. The reduction potential of a substance can be conveniently obtained by cyclic voltammetry (CV) and it is measured vs. SCE. The measurement of the reduction potential of a substance can be as following: A Model CHI660 electrochemical analyzer (CH Instruments, Inc., Austin, Tex.) is employed to carry out the electrochemical measurements. Both CV and Osteryoung square-wave voltammetry (SWV) can be used to characterize the redox properties of the substance. A glassy carbon (GC) disk electrode (A=0.071 cm²) is used as working electrode. The GC electrode is polished with 0.05 μm alumina slurry, followed by sonication cleaning in deionized water twice and rinsed with acetone in between water cleaning. The electrode is finally cleaned and activated by electrochemical treatment prior to use. A platinum wire can be used as the counter electrode and the SCE is used as a quasi-reference electrode to complete a standard 3-electrode electrochemical cell. A mixture of acetonitrile and toluene (1:1 MeCN/toluene) or methylene chloride (MeCl₂) can be used as organic solvent systems. All solvents used are ultra low water grade (<10 ppm water). The supporting electrolyte, tetrabutylammonium tetrafluoroborate (TBAF) is recrystallized twice in isopropanol and dried under vacuum for three days. Ferrocene (Fc) can be used as an internal standard ($E^{red}_{FC}$=0.50 V vs. SCE in 1:1 MeCN/toluene, $E^{red}_{FC}$=0.55 V vs. SCE in MeCl₂, 0.1 M TBAF). The testing solution is purged with high purity nitrogen gas for approximately 15 minutes to remove oxygen and a nitrogen blanket is kept on the top of the solution during the course of the experiments. All measurements are performed at ambient temperature of 25±1° C. If the compound of interest has insufficient solubility, other solvents can be selected and used by those skilled in the art. Alternatively, if a suitable solvent system cannot be identified, the electron-accepting material can be deposited onto the electrode and the reduction potential of the modified electrode can be measured.

Electron deficient organic materials suitable for use in the electron-accepting layers include not only simple compounds containing at least carbon and hydrogen, but also include metal complexes, e.g., transition metal complexes having organic ligands and organometallic compounds, as long as their reduction potentials are more positive than −0.5 V vs. SCE, preferably more positive than −0.1 V. Organic materials for the electron-accepting layer can include small molecules (capable of being deposited by vapor deposition), polymers, dendrimers, or combinations. Some examples of organic materials having a reduction potential greater than −0.5 V vs. SCE that can be used to form the electron-accepting layer include, but are not limited to, derivatives of hexaazatriphenylene and tetracyanoquinodimethane.

The organic material used in the electron-accepting layer can be a chemical compound of Formula I:

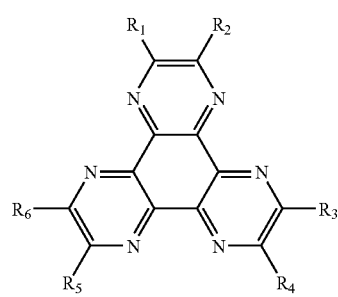

Formula I wherein $R_1$-$R_6$ represents hydrogen or a substituent independently selected from the group including halo, nitrile (—CN), nitro (—NO₂), sulfonyl (—SO₂R), sulfoxide (—SOR), trifluoromethyl (—CF₃), ester (—CO—OR), amide (—CO—NHR or —CO—NRR'), substituted or unsubstituted aryl, substituted or unsubstituted heteroaryl, and substituted or unsubstituted alkyl, where R and R' include substituted or unsubstituted alkyl or aryl; or wherein $R_1$ and $R_2$, $R_3$, and $R_4$, or $R_5$ and $R_6$, combine form a ring structure including an aromatic ring, a heteroaromatic ring, or a nonaromatic ring, and each ring is substituted or unsubstituted.

Materials included within the definition of include small molecules, dendrimers, and polymers. When polymeric, for example, the hexaazatriphenylene unit can be a pendant group attached to a polymeric backbone, or can be part of a polymeric backbone. Czarnik et al. in U.S. Pat. No. 4,780,536 have disclosed the preparation of the compounds.

Specifically, the organic material used in the electron-accepting layer can be a chemical compound of Formula Ia, also known as hexacyanohexaazatriphenylene:

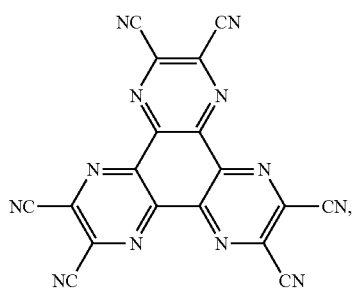

Formula Ia or can be a chemical compound of Formula Ib:

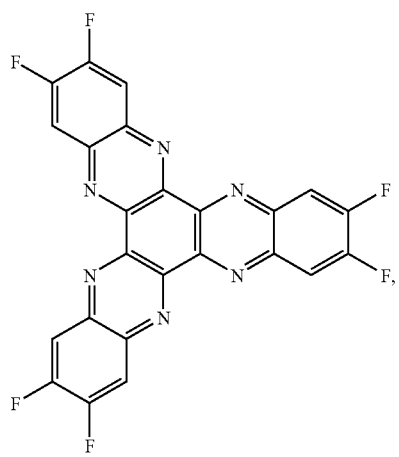

Formula Ib or can be a chemical compound of Formula Ic:

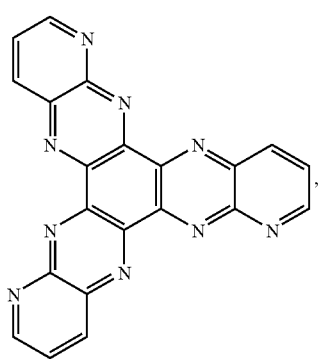

Formula Ic or can be a chemical compound of Formula Id:

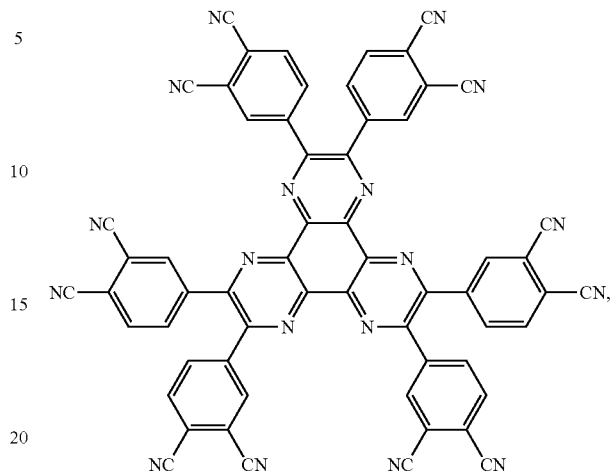

Formula Id or can be a chemical compound of Formula Ie:

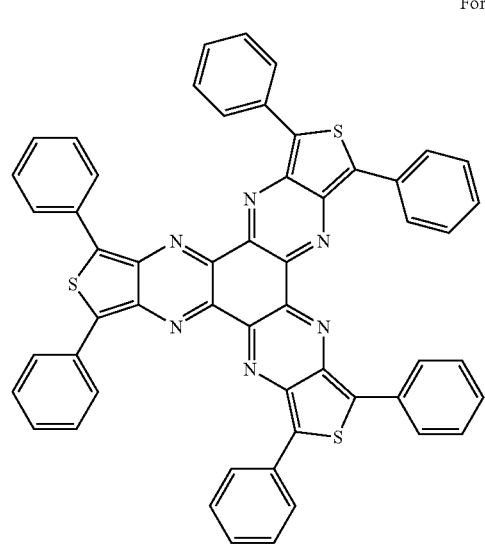

Formula Ie

The organic material used in the electron-accepting layer can also be a chemical compound of Formula II:

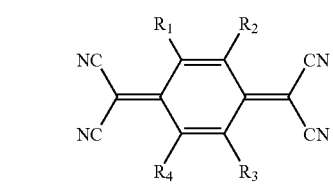

Formula II wherein $R_1$-$R_4$ represents hydrogen or substituents independently selected from the group including nitrile (—CN), nitro (—$NO_2$), sulfonyl (—$SO_2R$), sulfoxide (—SOR), trifluoromethyl (—$CF_3$), ester (—CO—OR), amide (—CO—NHR or —CO—NRR'), substituted or unsubstituted aryl, substituted or unsubstituted heteroaryl, and substituted or unsubstituted alkyl, where R and R' include substituted or unsubstituted alkyl or aryl; or wherein $R_1$ and $R_2$, or $R_3$, and $R_4$, combine to form a ring structure including an aromatic ring, a heteroaromatic ring, or a nonaromatic ring, and each ring is substituted or unsubstituted.

Materials included within the definition of include small molecules, dendimers, and polymers. When polymeric, for example, the tetracyanoquinone unit can be a pendant group attached to a polymeric backbone, or can be part of a polymeric backbone. Acker et al. in U.S. Pat. No. 3,115,506 have disclosed the preparation of the compounds.

Specifically, the organic material used in the electron-accepting layer can be a chemical compound of Formula IIa:

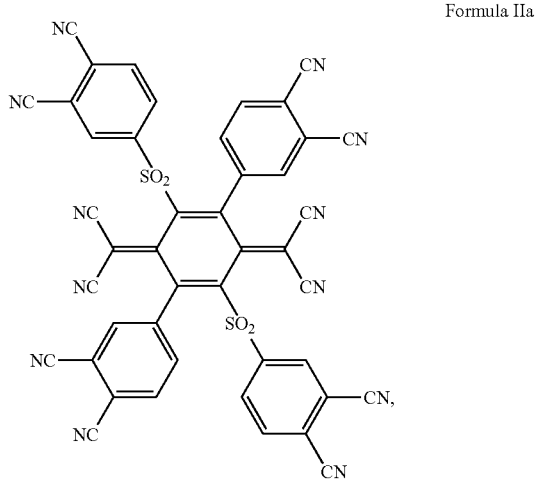

Formula IIa or can be a chemical compound of Formula IIb:

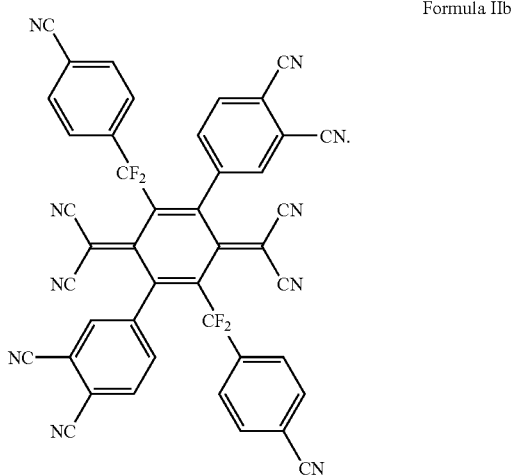

Formula IIb

A useful thickness of the electron-accepting layers is typically between 3 and 100 nm.

OLED devices are commonly formed on a supporting substrate, e.g. OLED substrate 20. The electrode in contact with the substrate is conveniently referred to as the bottom electrode. In an inverted structure as described herein, the bottom electrode is the cathode. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light-absorbing, or light reflective. Substrates for use in this case include, but are not limited to, glass, plastic, semiconductor materials, silicon, ceramics, and circuit board materials. Of course, it is necessary to provide in these device configurations a light-transparent top electrode.

A cathode 30 is formed over substrate 20. If the device is bottom-emitting, the electrode must be transparent or nearly transparent. For such applications, metals must be thin (preferably less than 25 nm) or one must use transparent conductive oxides (e.g. indium-tin oxide, indium-zinc oxide), or a combination of these materials. Optically transparent cathodes have been described in more detail in U.S. Pat. No. 5,776,623. If the device is top-emitting, the cathode can be any conductive material known to be useful in OLED devices, including metals such as aluminum, molybdenum, gold, iridium, silver, magnesium, the above transparent conductive oxides, or combinations of these. Desirable materials promote electron injection at low voltage and have effective stability. Useful cathode materials often contain a low work function metal (<4.0 eV) or metal alloy. Evaporation, sputtering, or chemical vapor deposition can deposit cathode materials. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

An anode 90 is formed over the other OLED layers. When EL emission is viewed through the anode, the anode should be transparent, or substantially transparent, to the emission of interest. Common transparent anode materials used in the present invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, and metal selenides such as zinc selenide, and metal sulfides such as zinc sulfide, can be used as the anode. For applications where EL emission is viewed only through the cathode electrode, the transmissive characteristics of the anode are immaterial and many conductive materials can be used, regardless if transparent, opaque, or reflective. Example conductors for the present invention include, but are not limited to, aluminum, silver, gold, iridium, molybdenum, palladium, and platinum. Typical anode materials, transmissive or otherwise, have a work function greater than 4.0 eV. Any suitable process such as evaporation, sputtering, chemical vapor deposition, or electrochemical deposition can deposit desired anode materials. If necessary, anode materials can be patterned using well-known photolithographic processes.

In one useful embodiment wherein inverted OLED device 15 is a bottom-emitting device, cathode 30 comprises indium-tin oxide while anode 90 comprises aluminum. In another useful embodiment wherein inverted OLED device 15 is a top-emitting device, cathode 30 comprises aluminum while anode 90 comprises indium-tin oxide.

Hole-transporting layer 55 can comprise any hole-transporting material useful in OLED devices, many examples of which are known to those skilled in the art. Desired hole-transporting materials can be deposited by any suitable ways such as evaporation, sputtering, chemical vapor deposition, electrochemical processes, thermal transfer, or laser thermal transfer from a donor material. Hole-transporting materials useful in hole-transporting layers are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Klupfel et al. in U.S. Pat. No. 3,180,730 illustrate exemplary monomeric triarylamines. Brantley et al. in U.S. Pat. Nos. 3,567,450 and 3,658,520 disclose other suitable triarylamines substituted with one or more vinyl radicals or comprise at least one active hydrogen-containing group.

A more preferred class of aromatic tertiary amines are those which include at least two aromatic tertiary amine moieties as described in U.S. Pat. Nos. 4,720,432 and 5,061,569. Such compounds include those represented by structural Formula A.

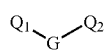

A wherein:

$Q_1$ and $Q_2$ are independently selected aromatic tertiary amine moieties; and G is a linking group such as an arylene, cycloalkylene, or alkylene group of a carbon to carbon bond.

One class of such aromatic tertiary amines are the tetraaryldiamines. Desirable tetraaryldiamines include two diarylamino groups linked through an arylene group. Useful tetraaryldiamines include those represented by Formula B.

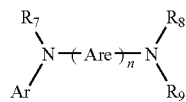

B wherein:

each Are is an independently selected arylene group, such as a phenylene or anthracene moiety;

n is an integer of from 1 to 4; and

Ar, $R_7$, $R_8$, and $R_9$ are independently selected aryl groups.

The various alkyl, alkylene, aryl, and arylene moieties of the foregoing structural Formulae L and M can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties. Usefully, the hole-transporting host material is an N,N,N',N'-tetraarylbenzidine, wherein the Are of Formula B represents a phenylene group and n equals 2.

Hole-transporting layer 55 can include multiple layers and hole-transporting materials. One or more of such layers can optionally include p-type dopants such as F4-TCNQ.

Electron-transporting layer 40 can comprise any electron-transporting material useful in OLED devices, many examples of which are known to those skilled in the art. Electron-transporting layer 40 can contain one or more metal chelated oxinoid compounds, including chelates of oxine itself, also commonly referred to as 8-quinolinol or 8-hydroxyquinoline. Such compounds help to inject and transport electrons and exhibit both high levels of performance and are readily fabricated in the form of thin films. Exemplary of contemplated oxinoid compounds are those satisfying structural Formula C.

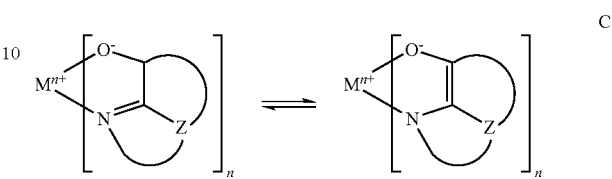

C wherein:

M represents a metal;

n is an integer of from 1 to 3; and

Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato)aluminum(III)];

CO-2: Magnesium bisoxine [alias, bis(8-quinolinolato)magnesium(II)];

CO-3: Bis[benzo {f}-8-quinolinolato]zinc (II);

CO-4: Bis(2-methyl-8-quinolinolato)aluminum(III)-μ-oxo-bis(2-methyl-8-quinolinolato)aluminum(III);

CO-5: Indium trisoxine [alias, tris(8-quinolinolato)indium];

CO-6: Aluminum tris(5-methyloxine) [alias, tris(5-methyl-8-quinolinolato)aluminum(III)];

CO-7: Lithium oxine [alias, (8-quinolinolato)lithium(I)];

CO-8: Gallium oxine [alias, tris(8-quinolinolato)gallium (III)]; and

CO-9: Zirconium oxine [alias, tetra(8-quinolinolato)zirconium(IV)].

Other electron-transporting materials include various butadiene derivatives as disclosed in U.S. Pat. No. 4,356,429 and various heterocyclic optical brighteners as described in U.S. Pat. No. 4,539,507. Benzazoles, oxadiazoles, triazoles, pyridinethiadiazoles, triazines, phenanthroline derivatives, and some silole derivatives are also useful electron-transporting materials. Substituted 1,10-phenanthroline compounds known to be useful as electron-transporting materials are disclosed in JP2003/115387; JP2004/311184; JP2001/267080; and WO2002/043449.

The electron-transporting layer 40 can include multiple layers of electron-transporting materials. One or more of these layers can include an n-type dopant, e.g., an alkaline or alkali metal such as lithium or cesium.

The embodiment shown herein includes two light-emitting layers: blue light-emitting layer 50b and yellow light-emitting layer 50y. However, this invention is not limited to this configuration. A large variety of light-emitting layers are known in the art and can be used in this invention. Such light-emitting layer can include red light-emitting layers, yellow light-emitting layers, green light-emitting layers, blue light-emitting layers, or combinations of these. Light-emitting layers such as those described herein produce light in response to hole-electron recombination. Desired organic light-emitting materials can be deposited by any suitable way such as evaporation, sputtering, chemical vapor deposition, electrochemical processes, or radiation thermal transfer from a donor material. The light-emitting layers in this invention comprise one or more host materials doped with one or more light-emitting guest compounds or dopants where light emission comes primarily from the dopant. A dopant is selected to produce color light having a particular spectrum and to have other desirable properties. Dopants are typically coated as 0.01 to 15% by weight into the host material.

A light-emitting layer can include an anthracene host, desirably a 9,10-diarylanthracene, certain derivatives of which (Formula F) are known to constitute a class of useful host materials capable of supporting electroluminescence, and are particularly suitable for light emission of wavelengths longer than 400 nm, e.g., blue, green, yellow, orange or red

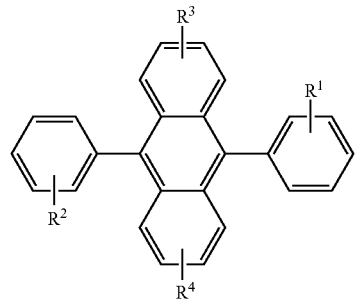

F wherein $R^1$, $R^2$, $R^3$, and $R^4$ represent one or more substituents on each ring where each substituent is individually selected from the following groups:

Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl, pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;
Group 5: alkoxylamino, alkylamino, or arylamino of from 1 to 24 carbon atoms; and
Group 6: fluorine or cyano.

Particularly useful are compounds wherein $R^1$ and $R^2$, and in some cases $R^3$, represent additional aromatic rings.

Also useful as host or co-host materials are certain hole-transporting materials such as aromatic tertiary amines (e.g. Structures A and B, above) and certain electron-transporting materials such as chelated oxinoid compounds (e.g. Structure C, above).

In addition to a host material as described above, the light-emitting layers also include one or more dopants as the first light-emitting material. A red-light-emitting dopant can include a diindenoperylene compound of the following structure G:

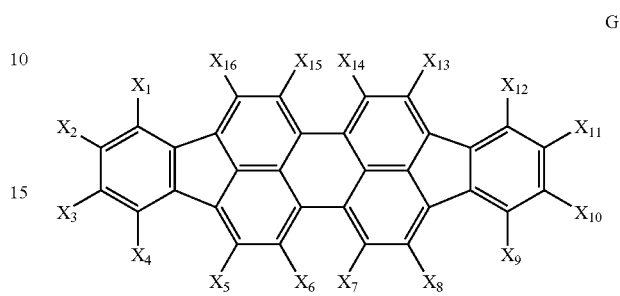

G wherein:

$X_1$-$X_{16}$ are independently selected as hydrogen or substituents that include alkyl groups of from 1 to 24 carbon atoms; aryl or substituted aryl groups of from 5 to 20 carbon atoms; hydrocarbon groups containing 4 to 24 carbon atoms that complete one or more fused aromatic rings or ring systems; or halogen, provided that the substituents are selected to provide an emission maximum between 560 nm and 640 nm.

Hatwar et al., the contents of which are incorporated by reference, show illustrative examples of useful red dopants of this class U.S. Pat. No. 7,247,394.

Some other red dopants belong to the DCM class of dyes represented by Formula H:

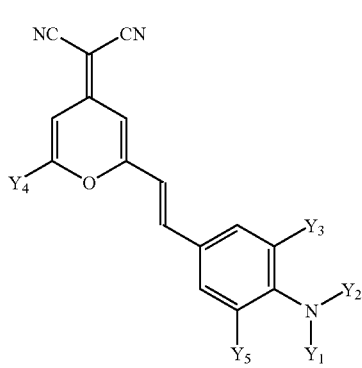

H wherein $Y_1$-$Y_5$ represent one or more groups independently selected from: hydro, alkyl, substituted alkyl, aryl, or substituted aryl; $Y_1$-$Y_5$ independently include acyclic groups or can be joined pair wise to form one or more fused rings; provided that $Y_3$ and $Y_5$ do not together form a fused ring. Ricks et al., the contents of which are incorporated by reference, show structures of particularly useful dopants of the DCM class in U.S. Pat. No. 7,252,893.

A light-emitting yellow dopant can include a compound of the following structures:

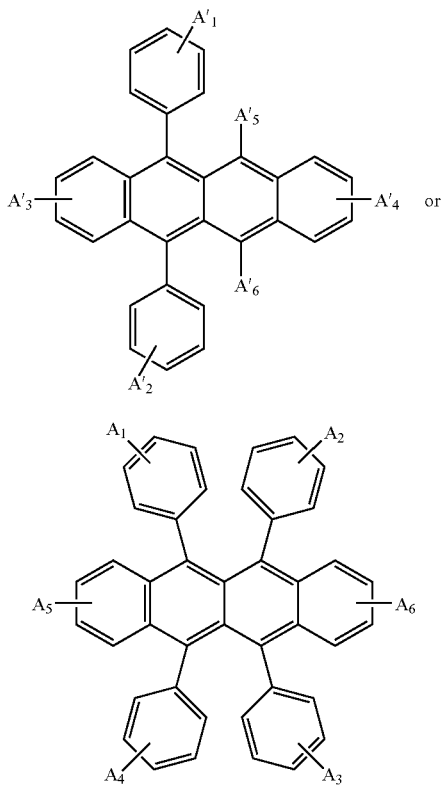

wherein $A_1$-$A_6$ and $A'_1$-$A'_6$ represent one or more substituents on each ring and where each substituent is individually selected from one of the following:

Category 1: hydrogen, or alkyl of from 1 to 24 carbon atoms;
Category 2: aryl or substituted aryl of from 5 to 20 carbon atoms;
Category 3: hydrocarbon containing 4 to 24 carbon atoms, completing a fused aromatic ring or ring system;
Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;
Category 5: alkoxylamino, alkylamino, or arylamino of from 1 to 24 carbon atoms; or
Category 6: fluoro or cyano.

Ricks et al show examples of particularly useful yellow dopants.

A green light-emitting dopant can include a quinacridone compound, e.g. a compound of the following structure:

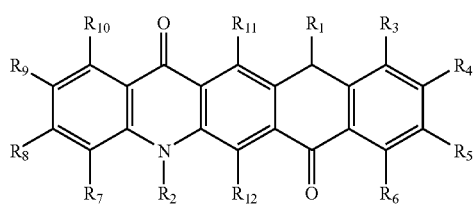

wherein substituent groups $R_1$ and $R_2$ are independently alkyl, alkoxyl, aryl, or heteroaryl; and substituent groups $R_3$ through $R_{12}$ are independently hydrogen, alkyl, alkoxyl, halogen, aryl, or heteroaryl, and adjacent substituent groups $R_3$ through $R_{10}$ can optionally be connected to form one or more ring systems, including fused aromatic and fused heteroaromatic rings, provided that the substituents are selected to provide an emission maximum between 510 nm and 540 nm. Alkyl, alkoxyl, aryl, heteroaryl, fused aromatic ring and fused heteroaromatic ring substituent groups can be further substituted. Some examples of useful quinacridones include those disclosed in U.S. Pat. No. 5,593,788 and in US2004/0001969A1.

Examples of useful quinacridone green dopants include:

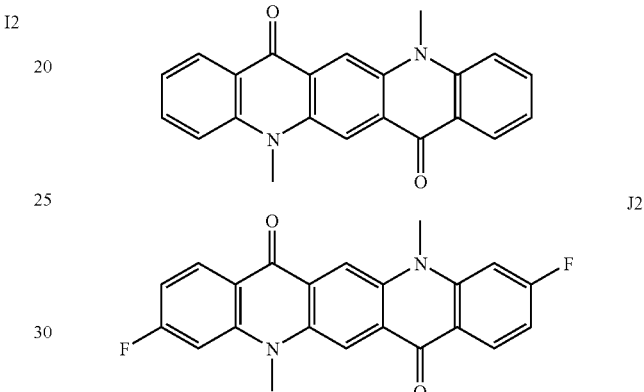

A green light-emitting dopant can also include a 2,6-diaminoanthracene light-emitting dopant, as represented by the formula below:

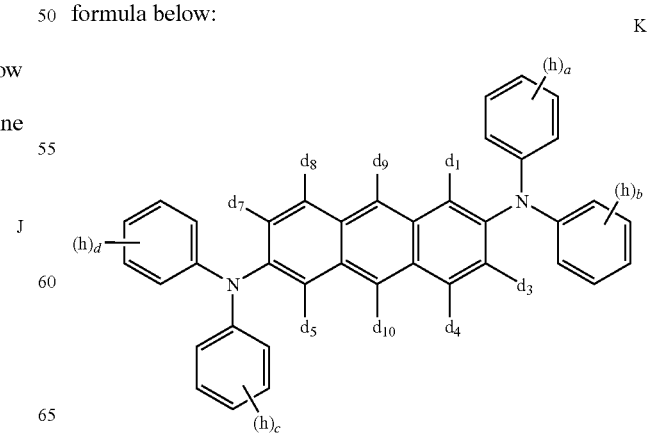

wherein $d_1$, $d_3$-$d_5$, and $d_7$-$d_{10}$ can be the same or different and each represents hydrogen or an independently selected substituent, and each h can be the same or different and each represents one or more independently selected substituents, provided that two substituents can combine to form a ring group and a-d are independently 0-5.

A blue-light-emitting dopant can include a bis(azinyl)azene boron complex compound of the structure L:

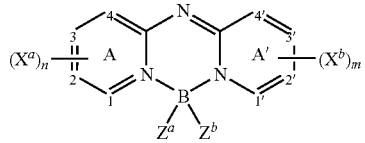

wherein:

A and A' represent independent azine ring systems corresponding to 6-membered aromatic ring systems containing at least one nitrogen;

$(X^a)_n$ and $(X^b)_m$ represent one or more independently selected substituents and include acyclic substituents or are joined to form a ring fused to A or A';

m and n are independently 0 to 4;

$Z^a$ and $Z^b$ are independently selected substituents;

1, 2, 3, 4, 1', 2', 3', and 4' are independently selected as either carbon or nitrogen atoms; and provided that $X^a$, $X^b$, $Z^a$, and $Z^b$, 1, 2, 3, 4, 1', 2', 3', and 4' are selected to provide blue luminescence.

Ricks et al disclose some examples of the above class of dopants. The concentration of this class of dopants in a light-emitting layer is desirably between 0.1% and 5%.

Another class of blue dopants is the perylene class. Particularly useful blue dopants of the perylene class include perylene and tetra-t-butylperylene (TBP).

Another class of blue dopants includes blue-emitting derivatives of such styrylarenes and distyrylarenes as distyrylbenzene, styrylbiphenyl, and distyrylbiphenyl, including compounds described in U.S. Pat. No. 5,121,029, and US Application Publication No. 2006/0093856. Among such derivatives that provide blue luminescence, particularly useful in second light-emitting layer 52 are those substituted with diarylamino groups and herein termed aminostyrylarene dopants. Examples include bis[2-[4-[N,N-diarylamino]phenyl]vinyl]-benzenes of the general structure M1 shown below:

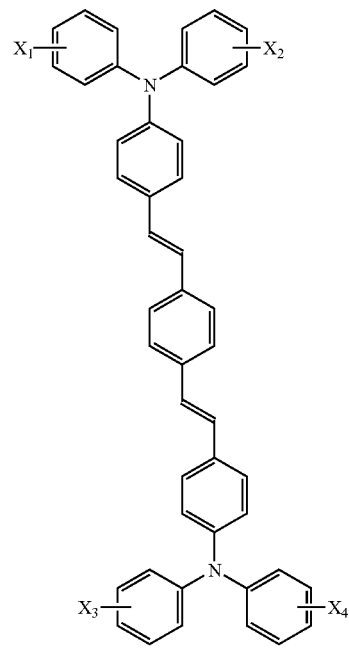

[N,N-diarylamino][2-[4-[N,N-diarylamino]phenyl]vinyl]biphenyls of the general structure M2 shown below:

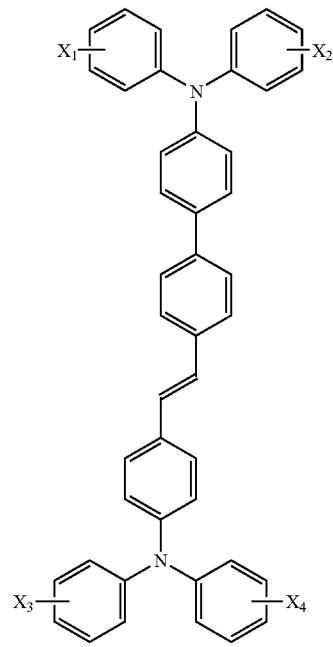

and bis[2-[4-[N,N-diarylamino]phenyl]vinyl]biphenyls of the general structure M3 shown below:

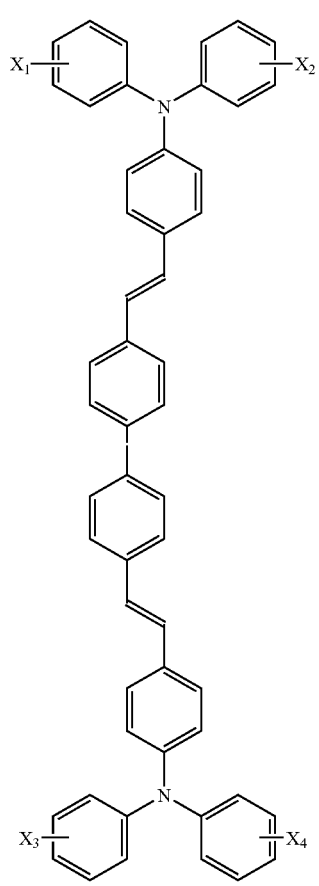

In Formulas M1 to M3, $X_1$-$X_4$ can be the same or different, and individually represent one or more substituents such as alkyl, aryl, fused aryl, halo, or cyaNo. In a preferred embodiment, $X_1$-$X_4$ are individually alkyl groups, each containing from one to about ten carbon atoms.

Figure 3:
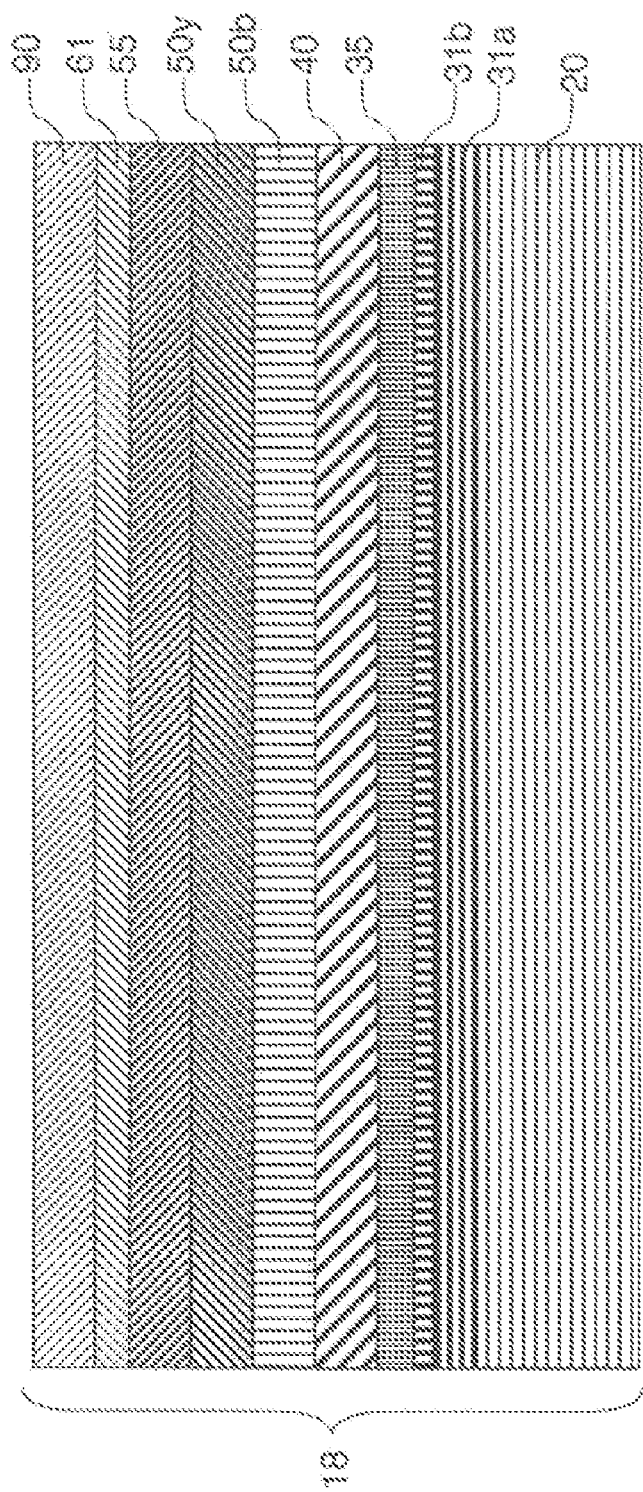
FIG. 3 shows a cross-sectional view of another embodiment of an inverted OLED device in accordance with this invention.

Turning now to FIG. 3, there is shown a cross-sectional view of another embodiment of an inverted OLED device in accordance with this invention. This embodiment is similar to that of inverted OLED device 15 of FIG. 2. However, for a cathode, inverted OLED device 18 includes two layers: cathode layer 31a and cathode layer 31b. A useful example of this embodiment is wherein cathode layer 31a is an aluminum layer, cathode layer 31b is an indium-tin oxide layer over the aluminum, anode 90 comprises indium-tin oxide, and inverted OLED device 18 is a top-emitting device.

Figure 4:
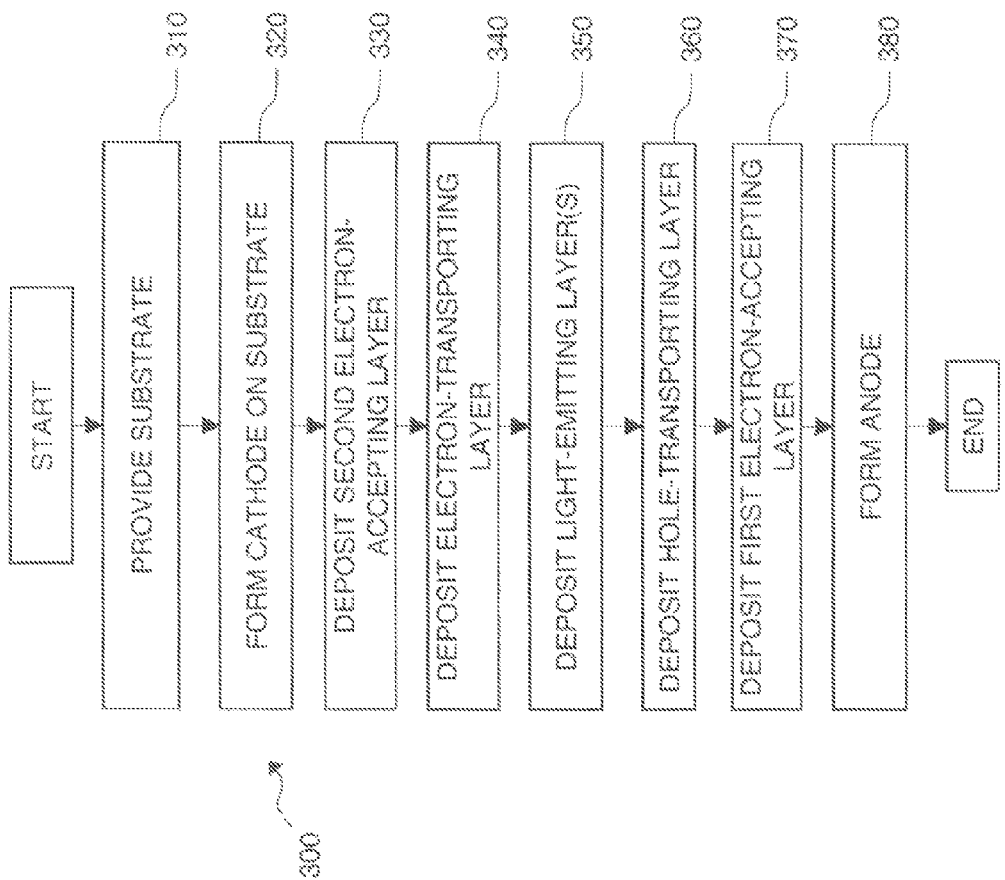
FIG. 4 shows a block diagram of one embodiment of a method of making an inverted OLED device according to this invention.

Turning now to FIG. 4, and referring also to FIG. 2, there is shown a block diagram of one embodiment of a method of making an inverted OLED device according to this invention. At the start of method 300, a substrate 20 as described above is provided (Step 310). Then a cathode 30 is formed on substrate 20 by well-known methods (Step 320). A second electron-accepting layer 35 is deposited on cathode 30 (Step 330). Second electron-accepting layer 35 includes an electron-deficient organic material as described above that does not inhibit the injection of electrons, and is deposited by methods well-known for depositing hole-injecting layers. An electron-transporting layer 40 is deposited over second electron-accepting layer 35 by well-known methods (Step 340). One or more light-emitting layers (e.g. 50b and 50a) are deposited over electron-transporting layer 40 by well-known methods (Step 350). A hole-transporting layer 55 is deposited in contact with the last-deposited light-emitting layer by well-known methods (Step 360). A first electron-accepting layer 61 is deposited over hole-transporting layer 55 by well-known methods (Step 370). First electron-accepting layer 61 includes an electron deficient organic material as described above. Finally, an anode 90 is formed in contact with hole-injecting layer 60 by well-known methods (Step 380).

Additional layers can be provided between steps 340 and 370 such as exciton, electron and hole-blocking layers as taught in the art can be employed in devices of this invention. Hole-blocking layers are commonly used to improve efficiency of phosphorescent emitter devices, for example, as in US 20020015859, WO 00/70655A2, WO 01/93642A1, US 20030068528 and US 20030175553 A1.

This invention can be used in so-called tandem device architecture, for example, as taught in U.S. Pat. No. 6,337, 492, US 2003/0170491, and U.S. Pat. No. 6,717,358. Such tandem devices have multiple electroluminescent units provided between an anode and a cathode, usually with connector layer between units to promote charge generation and injection into the electroluminescent units.

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimation "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimation boats or the materials can be pre-mixed and coated from a single boat or donor sheet or by flash evaporation. Patterned deposition can be achieved using shadow masks, integral shadow masks (U.S. Pat. No. 5,294,870), spatially-defined thermal dye transfer from a donor sheet (U.S. Pat. Nos. 5,688, 551, 5,851,709 and 6,066,357) and inkjet method (U.S. Pat. No. 6,066,357).

Most OLED devices are sensitive to moisture or oxygen, or both, so they are commonly sealed in an inert atmosphere such as nitrogen or argon. In sealing an OLED device in an inert environment, a protective cover can be attached using an organic adhesive, a metal solder, or a low melting temperature glass. Commonly, a getter or desiccant is also provided within the sealed space. Useful getters and desiccants include, alkali and alkaline metals, alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters in functional relationship with the light emitting areas of the display. Filters, polarizers, and anti-glare or anti-reflection coatings can also be provided over a cover or as part of a cover.

The OLED device can have a microcavity structure. In one useful example, one of the electrodes is essentially opaque and reflective; the other one is reflective and semitransparent.

The reflective electrode is preferably selected from Au, Ag, Al, or alloys thereof. The optical path length can be tuned by selecting the thickness of the organic layers or by placing a transparent optical spacer between the electrodes.

EXAMPLES

The invention and its advantages can be better appreciated by the following inventive and comparative examples. The layers described as vacuum-deposited were deposited by evaporation from heated boats under a vacuum of approximately $10^{-6}$ Torr. After deposition of the OLED layers each device was then transferred to a dry box for encapsulation. The OLED has an emission area of 10 mm$^2$. Applying a current of 20 mA/cm2 across electrodes tested the devices, except that the fade stability was tested at 80 mA/cm$^2$. The results from Examples 1 to 3 are given in Table 1.

Example 1

Comparative

A comparative bottom-emitting inverted OLED device was constructed in the following manner. This example used a first electron-accepting layer between the HTL and anode, but not a second electron-accepting layer between the cathode and ETL.
1. A clean glass substrate was deposited by sputtering with indium tin oxide (ITO) to form a transparent cathode of 85 nm thickness.
2. A 40 nm mixed electron-transporting layer was vacuum-deposited, including 49% 4,7-diphenyl-1,10-phenanthroline (also known as bathophen or Bphen), 49% tris(8-quinolinolato)aluminum (III) (ALQ) as co-host, with 2% Li metal.
3. The above-prepared substrate was further treated by vacuum-depositing a 20 nm blue light-emitting layer including 92% 9-(2-naphthyl)-10-(biphenyl-4-yl)anthracene (NBA) host and 7% 4,4'-bis[N-(1-naphthyl)-N-phenylamino]biphenyl (NPB) co-host with 1% tetra-t-butylperylene (TBP) as blue-emitting dopant.
4. The above-prepared substrate was further treated by vacuum-depositing a 20 nm yellow light-emitting layer of 68% NPB (as host) and 30% NBA (as co-host) with 2% yellow-orange emitting dopant diphenyltetra-t-butylrubrene (PTBR).

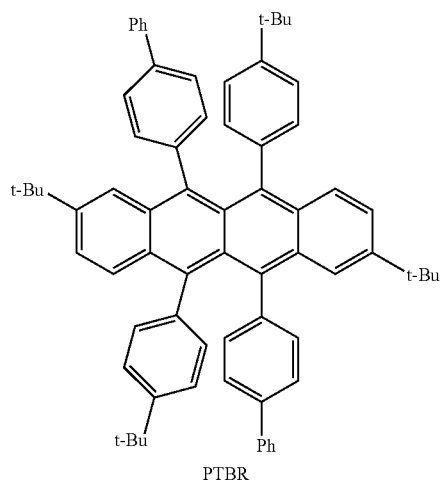

PTBR

5. The above-prepared substrate was further treated by vacuum-depositing a 10 nm layer of 4,4'-bis[N-(1-naphthyl)-N-phenylamino]biphenyl (NPB) as a hole-transporting layer (HTL).
6. The above-prepared substrate was further treated by vacuum-depositing a 10 nm layer of hexacyanohexaazatriphenylene (CHATP) as a first electron-accepting layer.

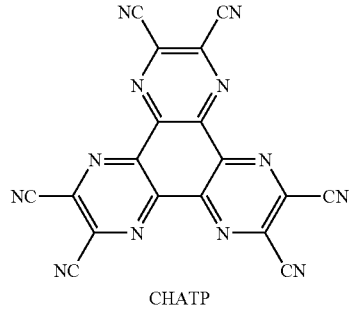

CHATP

7. A 100 nm layer of aluminum was evaporatively deposited onto the substrate to form an anode layer.

Example 2

Inventive

An inventive bottom-emitting inverted OLED device was constructed in the following manner:
1. A clean glass substrate was deposited by sputtering with ITO to form a transparent cathode of 85 nm thickness.
2. The above-prepared substrate was further treated by vacuum-depositing a 10 nm layer of CHATP as a second electron-accepting layer.
3. A 40 nm mixed electron-transporting layer was vacuum-deposited, including 49% Bphen, 49% ALQ as co-host, with 2% Li metal.
4. The above-prepared substrate was further treated by vacuum-depositing a 20 nm blue light-emitting layer including 92% NBA host and 7% NPB co-host with 1% tetra-t-butylperylene (TBP) as blue-emitting dopant.
5. The above-prepared substrate was further treated by vacuum-depositing a 20 nm yellow light-emitting layer of 68% NPB (as host) and 30% NBA (as co-host) with 2% PTBR.
6. The above-prepared substrate was further treated by vacuum-depositing a 10 nm layer of NPB as a hole-transporting layer (HTL).
7. The above-prepared substrate was further treated by vacuum-depositing a 10 nm layer of CHATP as a first electron-accepting layer.
8. A 100 nm layer of aluminum was evaporatively deposited onto the substrate to form an anode layer.

Example 3

Inventive

An inventive top-emitting inverted OLED device was constructed as described above for Example 2, except that Steps 1, 3, 6, and 8 were as follows:

1. A clean glass substrate was deposited by vaporizing aluminum metal in an evaporating boat to form a layer of 100 nm thickness, and a 10 nm ITO layer was deposited over this to form a reflective cathode.
3. A 25 nm mixed electron-transporting layer was vacuum-deposited, including 49% Bphen, 49% ALQ as co-host, with 2% Li metal.
6. The above-prepared substrate was further treated by vacuum-depositing a 150 nm layer of NPB as a hole-transporting layer (HTL).
8. The above-prepared substrate was further treated by sputtering ITO to form a 50 nm transparent anode layer.

As shown in Table 1, the voltage rise for the inventive examples over the lifetime of the device was smaller than for the comparative device.

TABLE 1

Device data measured at 20 mA/cm$^2$ (except fade data)

| Device # | Voltage | Lum Efficiency (cd/A) | CIEx | CIEy | QE % | Voltage Rise | Room Temp Fade Stability @80 mA/cm$^2$ (hrs to 50%) |
|---|---|---|---|---|---|---|---|
| Example 1 (Comparative) | 4.6 | 10.8 | 0.33 | 0.37 | 4.4 | 1.2 | 630 |
| Example 2 (Inventive) | 4.4 | 10.9 | 0.34 | 0.39 | 4.2 | 0.6 | 630 |
| Example 3 (Inventive) | 5.2 | 7.50 | 0.36 | 0.35 | 3.7 | 0.1 | 400 |

Figure 5:
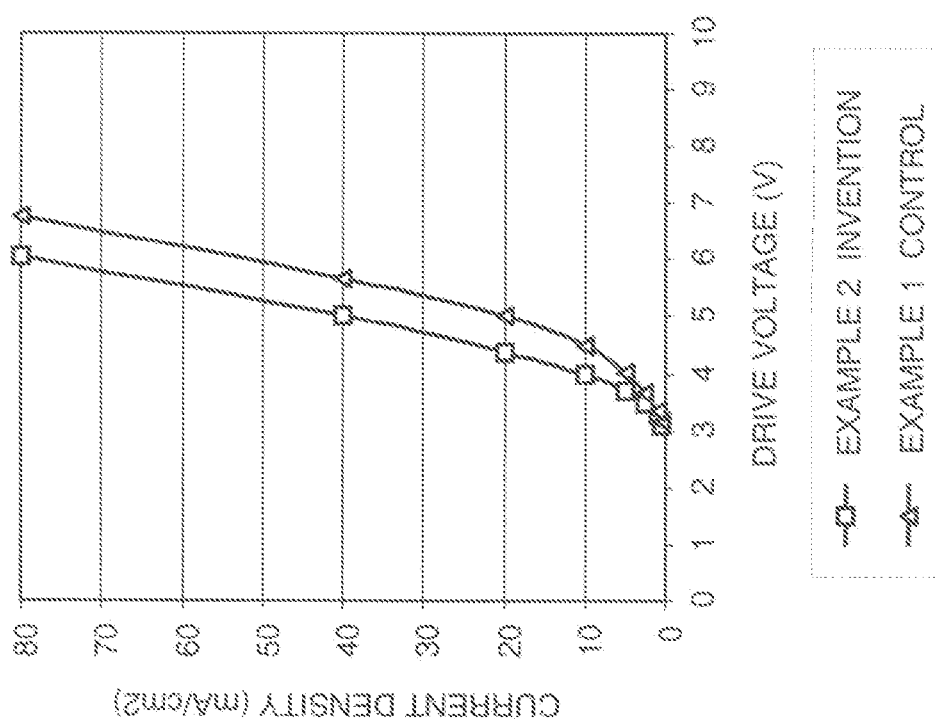
FIG. 5 shows a comparison of current density vs. drive voltage for an inventive inverted OLED device in comparison to an non-inventive example.

Turning now to FIG. 5, there is shown a comparison of current density vs. drive voltage for an inventive inverted OLED device (Example 2) in comparison to an non-inventive example (Example 1). The inventive example shows a lower drive voltage necessary to produce a given current density.

Figure 6:
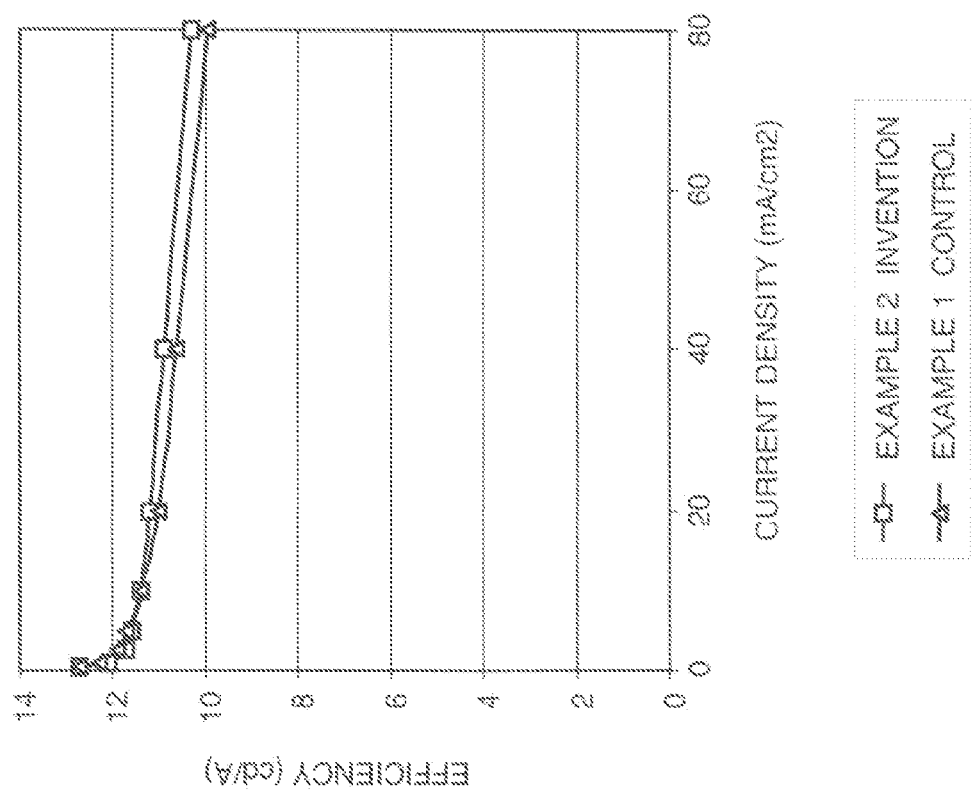
FIG. 6 shows a comparison of efficiency vs. current density for an inventive inverted OLED device in comparison to an non-inventive example.

Turning now to FIG. 6, there is shown a comparison of efficiency vs. current density for an inventive inverted OLED device (Example 2) in comparison to a non-inventive example (Example 1). The inventive example shows a greater efficiency at higher current densities.

A test was done on the effectiveness of using first and second electron-accepting layers in a conventional (not inverted) device structure. The two examples below describe this. The results from Examples 4 and 5 are given in Table 2, and were obtained as described above for Examples 1 to 3.

Example 4

Comparative

A comparative bottom-emitting conventional OLED device was constructed in the following manner:
1. A clean glass substrate was deposited by sputtering with indium tin oxide (ITO) to form a transparent anode of 85 nm thickness.
2. The above-prepared substrate was further treated by vacuum-depositing a 10 nm layer of hexacyanohexaaza-triphenylene (CHATP) as a first electron-accepting layer.
3. The above-prepared substrate was further treated by vacuum-depositing a 20 nm yellow light-emitting layer of 68% NPB (as host) and 30% NBA (as co-host) with 2% PTBR.
4. The above-prepared substrate was further treated by vacuum-depositing a 20 nm blue light-emitting layer including 92% NBA host and 7% NPB co-host with 1% TBP as blue-emitting dopant.
5. A 40 nm mixed electron-transporting layer was vacuum-deposited, including 49% Bphen, 49% ALQ as co-host, with 2% Li metal.
6. A 100 nm layer of aluminum was evaporatively deposited onto the substrate to form a cathode layer.

Example 5

Comparative

A comparative bottom-emitting conventional OLED device was constructed as described above for Example 4, except that Steps 6 and 7 were as follows:

6. The above-prepared substrate was further treated by vacuum-depositing a 10 nm layer of CHATP as a second electron-accepting layer.
7. A 100 nm layer of aluminum was evaporatively deposited onto the substrate to form a cathode layer.

As shown in Table 2, the voltage rise for the examples over the lifetime of the devices was no different in the presence or absence of a second electron-accepting layer. This is in contrast to the inverted structure examples of the present invention where the second electron-accepting layer in combination with the first electron-accepting layer provided a significant and unexpected improvement (reduction) in voltage rise.

TABLE 2

Device data measured at 20 mA/cm² (except fade data)

| Device # | Voltage | Lum Efficiency (cd/A) | CIEx | CIEy | QE % | Voltage Rise | Room Temp Fade Stability @80 mA/cm² (hrs to 50%) |
|---|---|---|---|---|---|---|---|
| Example 4 (Comparative) | 5.0 | 10.8 | 0.33 | 0.36 | 4.5 | 0.5 | 1900 |
| Example 5 (Comparative) | 5.0 | 10.3 | 0.33 | 0.37 | 4.3 | 0.5 | 2000 |

The invention has been described in detail with particular reference to certain preferred embodiments thereof, but it will be understood that variations and modifications can be effected within the spirit and scope of the invention. The entire contents of the patents and other publications referred to in this specification are incorporated herein by reference.

PARTS LIST

| | |
|---|---|
| 10 | inverted OLED device |
| 15 | inverted OLED device |
| 18 | inverted OLED device |
| 20 | substrate |
| 30 | cathode |
| 31a | cathode layer |
| 31b | cathode layer |
| 35 | second electron-accepting layer |
| 40 | electron-transporting layer |
| 50b | blue light-emitting layer |
| 50y | yellow light-emitting layer |
| 55 | hole-transporting layer |
| 60 | hole-injecting layer |
| 61 | first electron-accepting layer |
| 90 | anode |
| 300 | method |
| 310 | step |
| 320 | step |
| 330 | step |
| 340 | step |
| 350 | step |
| 360 | step |
| 370 | step |
| 380 | step |

The invention claimed is:

1. An inverted OLED device, comprising in sequence:
a. a substrate;
b. a cathode in contact with the substrate;
c. second electron-accepting layer including a second electron-deficient organic material constituting more than 50% by volume of the second electron-accenting layer and having a reduction potential greater than −0.5 V vs. a Saturated Calomel;
D. an electron-transporting layer;
E. at least one light-emitting layer;
F. a hole-transporting layer;
g. a first electron-accepting layer disposed between the hole-transporting layer and the anode and including a first electron-deficient organic material constituting more than 50% by volume of the first electron-accepting layer and having a reduction potential greater than −0.5 V vs. a Saturated Calomel; and
h. an anode.

2. The inverted OLED device of claim 1 wherein the first or second electron-deficient organic material is a hexaazatriphenylene derivative.

3. The inverted OLED device of claim 2 wherein the hexaazatriphenylene derivative is hexacyanohexaazatriphenylene.

4. The inverted OLED device of claim 2 wherein both the first and second electron deficient organic material is hexacyanohexaazatriphenylene and constitutes substantially all of the volume of the first and second electron-accepting layers.

5. The inverted OLED device of claim 1 where in the reduction potential for the first or second electron deficient organic materials is greater than −0.1V.

6. The inverted OLED device of claim 1 wherein the anode includes aluminum and the cathode includes indium-tin oxide.

7. The inverted OLED device of claim 1 wherein the anode includes indium-tin oxide and the cathode includes aluminum and a layer of indium-tin oxide over the aluminum.

8. The inverted OLED device of claim 1 wherein the first electron-accepting layer is in direct contact with the anode.

9. A method of making an inverted OLED device, comprising:
a. providing a substrate;
b. forming a cathode directly on the substrate;
c. depositing a second electron-accepting layer over the cathode including a second electron-deficient organic material constituting more than 50% by volume of the second electron-accepting layer and having a reduction potential greater than −0.5 V vs. a Saturated Calomel Electrode;
d. depositing in sequence an electron-transporting layer over the second electron-accepting layer, one or more light-emitting layers over the electron-transporting layer, and a hole-transporting layer over the last-deposited light-emitting layer;
e. depositing a first electron-accepting layer over the hole-transporting layer and including a first electron-deficient organic material constituting more than 50% by volume of the first electron-accepting layer and having a reduction potential greater than −0.5 V vs. a Saturated Calomel Electrode; and
forming an anode in contact with the first electron-accepting layer.

10. The method of claim 9 wherein both the first and second electron deficient organic material is hexacyanohexaazatriphenylene and constitutes substantially all of the volume of the first and second electron-accepting layers.

* * * * *